United States Patent
Abe et al.

(10) Patent No.: US 9,082,610 B2
(45) Date of Patent: Jul. 14, 2015

(54) METHOD FOR CLEANING SEMICONDUCTOR WAFER

(75) Inventors: Tatsuo Abe, Nishishirakawa (JP); Hitoshi Kabasawa, Nishishirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/113,329

(22) PCT Filed: May 11, 2012

(86) PCT No.: PCT/JP2012/003090
§ 371 (c)(1),
(2), (4) Date: Oct. 22, 2013

(87) PCT Pub. No.: WO2012/172724
PCT Pub. Date: Dec. 20, 2012

(65) Prior Publication Data
US 2014/0048100 A1 Feb. 20, 2014

(30) Foreign Application Priority Data
Jun. 17, 2011 (JP) .................................. 2011-134809

(51) Int. Cl.
*C23G 1/02* (2006.01)
*H01L 21/02* (2006.01)

(52) U.S. Cl.
CPC ................................ *H01L 21/02052* (2013.01)

(58) Field of Classification Search
None
See application file for complete search history.

(56) References Cited

U.S. PATENT DOCUMENTS

| 7,993,452 B2 * | 8/2011 | Hayashida et al. ............... 117/2 |
| 2007/0228524 A1 | 10/2007 | Hayashida et al. |

FOREIGN PATENT DOCUMENTS

| JP | A-2001-53050 | 2/2001 |
| JP | A-2002-203824 | 7/2002 |
| JP | A-2007-273911 | 10/2007 |

OTHER PUBLICATIONS

Dec. 17, 2013 International Preliminary Report on Patentability issued in International Application No. PCT/JP2012/003090.
Mar. 18, 2014 Decision of Refusal issued in Japanese Application No. 2011-134809 (with partial translation).
Japanese Office Action issued in Japanese Patent Application No. 2011-134809 dated Oct. 29, 2013 (w/ partial translation).
International Search Report issued in International Patent Application No. PCT/JP2012/003090 dated Aug. 14, 2012.
Mar. 23, 2015 Office Action issued in Taiwanese Patent Application No. 101118365.

* cited by examiner

*Primary Examiner* — Eric Golightly
(74) *Attorney, Agent, or Firm* — Oliff PLC

(57) ABSTRACT

The present invention provides a method for cleaning a semiconductor wafer, in which the method includes cleaning steps of HF cleaning, ozonated water cleaning and HF cleaning in this order at least one time, wherein in the HF cleaning carried out last in the method for cleaning the semiconductor wafer, cleaning is so carried out that an oxide film formed on a surface of the semiconductor wafer by the ozonated water is not entirely removed and to remain a part of a thickness thereof on the surface of the semiconductor wafer. As a result, a method for cleaning a semiconductor wafer in which a metal impurity level and a particle level can be reduced simultaneously in the cleaning of the semiconductor wafer is provided.

6 Claims, 2 Drawing Sheets

METHOD FOR CLEANING SEMICONDUCTOR WAFER

TECHNICAL FIELD

The present invention relates to a method for cleaning semiconductor wafer.

BACKGROUND ART

As one of the cleaning methods of the semiconductor wafer, it has been carried out a cleaning treatment by using ozonated water, diluted hydrofluoric acid, and pure water in combination. As a general flow of the cleaning in this case, the cleaning is carried out in the order of ozonated water cleaning→diluted hydrofluoric acid cleaning→ozonated water (pure water) cleaning→drying.

In this method, an organic material(s) attached to a surface of the semiconductor wafer is removed by the first ozonated water cleaning, an oxide film formed on the surface of the semiconductor wafer and metal impurities incorporated into the oxide film are simultaneously removed in the next diluted hydrofluoric acid cleaning, thereafter, when a protective oxide film is necessary for the surface of the semiconductor wafer, surface oxidation treatment by ozonated water (or pure water) is carried out. Also, for the purpose of improving a cleaning power, it has been practiced a method in which formation and etching of an oxide film on the surface of the semiconductor wafer are repeated by ozonated water and hydrofluoric acid (Patent Document 1).

For example, in the cleaning of a semiconductor wafer by a single wafer processing spin cleaning, ozonated water cleaning, HF (hydrofluoric acid) cleaning, and pure water cleaning are carried out in combination as mentioned above, and in the HF cleaning carried out after formation of an oxide film on the surface of a semiconductor wafer by the ozonated water cleaning, the oxide film itself is removed simultaneously with the metal impurities incorporated into the oxide film. According to this procedure, a surface (hereinafter referred to bare surface) in which oxide film is not formed is exposed at the surface of the semiconductor wafer, whereby the surface becomes the state in which particles are likely adhered and a particle level is degraded. Therefore, in the cleaning of a semiconductor wafer, it is the problem to reduce the metal impurity level and the particle level simultaneously.

CITATION LIST

Patent Literatures

Patent Document 1: Japanese Unexamined Patent Publication (Kokai) No. 2007-273911

SUMMARY OF THE INVENTION

Problems to be Solved by the Invention

The present invention has been accomplished in view of the above-mentioned circumstance, and an object thereof is to provide a method for cleaning a semiconductor wafer which can reduce both of a metal impurity level and a particle level at the surface of the semiconductor wafer simultaneously when the semiconductor wafer is subjected to the cleaning.

Means for Solving the Problems

To solve the above-mentioned problems, according to the present invention, it is provided a method for cleaning a semiconductor wafer which comprises cleaning steps of HF cleaning, ozonated water cleaning, and HF cleaning in this order at least one time, wherein, in the HF cleaning carried out at last in the method for cleaning the semiconductor wafer, cleaning is so carried out that an oxide film formed on a surface of the semiconductor wafer by the ozonated water is not entirely removed to remain a part of a thickness thereof on the surface of the semiconductor wafer.

According to this constitution, after removing metal impurities at the surface of the semiconductor wafer sufficiently by the HF cleaning previously carried out, when an oxide film formed on the surface of the semiconductor wafer by the ozonated water cleaning is dissolved by the last HF cleaning carried out in the method for cleaning the semiconductor wafer, and a part of the thickness thereof is remained, so that it can be restrained the state that the oxide film on the surface of the semiconductor wafer is entirely removed to expose the bare surface and the surface became the state that the particles are likely adhered thereto, whereby the metal impurity level and the particle level of the surface of the semiconductor wafer can be reduced simultaneously.

Also, the method is extremely convenient since only a part of the thickness of the oxide film is remained at the time of dissolving the oxide film by the last HF cleaning carried out in the cleaning of the surface of the semiconductor wafer.

At this time, it is preferred that the oxide film formed on the surface of the semiconductor wafer is entirely removed by the first HF cleaning in the method for cleaning the semiconductor wafer.

According to this constitution, metal impurities at the surface of the semiconductor wafer and the oxide film incorporating the same are certainly removed and the metal impurity level can be certainly reduced, and the oxide film may be remained in the HF cleaning thereafter without any problem.

At this time, it is preferred that the oxide film formed on the surface of the semiconductor wafer by the ozonated water cleaning is not entirely removed and to remain a part of a thickness thereof on the surface of the semiconductor wafer in the HF cleaning at the second time or later in the method for cleaning the semiconductor wafer.

According to this constitution, for example, even if the HF cleaning and the ozone cleaning are repeated, the oxide film is remained in the HF cleaning at the second time or later, so that it can be more certainly restrained the state that the oxide film on the surface of the semiconductor wafer is entirely removed to expose the bare surface so that the surface became the state where the particles are likely adhered thereto whereby the particle level of the surface of the semiconductor wafer is degraded.

At this time, in the method for cleaning the semiconductor wafer, the semiconductor wafer can be subjected to cleaning either by carrying out the HF cleaning after the ozonated water cleaning or by carrying out the ozonated water cleaning after the HF cleaning, which procedure may be alternately repeated twice or more.

According to this constitution, the metal impurity level and the particle level of the surface of the semiconductor wafer can be reduced more effectively so it is preferred.

At this time, a concentration of HF can be made 0.1 wt % to 1.5 wt % in the HF cleaning where the oxide film formed on the surface of the semiconductor wafer by the ozonated water cleaning is not entirely removed and to remain a part of a thickness thereof on the surface of the semiconductor wafer.

According to this constitution, it does not take a longer time for dissolution of the oxide film on the surface of the semiconductor wafer formed by the ozonated water cleaning, and it never causes the state that control of the thickness becomes difficult since the time taken for dissolution of the oxide film is too short so it is preferred.

At this time, a concentration of the ozonated water can be made 3 ppm or more in the ozonated water cleaning.

According to this constitution, cleaning effects by the ozonated water cleaning are more increased so it is preferred.

At this time, the HF cleaning and the ozonated water cleaning of the semiconductor wafer can be carried out by the single wafer processing spin cleaning.

Thus, to the HF cleaning and the ozonated water cleaning in the method for cleaning the semiconductor wafer of the present invention can be applied a single wafer processing spin cleaning.

Effect of the Invention

As explained above, when the method for cleaning the semiconductor wafer of the present invention is employed, it is possible that the particles on the surface of the semiconductor wafer can be effectively and conveniently reduced, and further the metal impurity level and the particle level of the surface of the semiconductor wafer can be reduced simultaneously.

BEST MODE FOR CARRYING OUT THE INVENTION

Hereinafter, the method for cleaning a semiconductor wafer of the present invention is explained in detail by referring to FIG. 1 as one example of the embodiments, but the present invention is not limited by these.

First, a semiconductor wafer to carry out cleaning by the cleaning method of the present invention is prepared. Here, the semiconductor wafer to be used is not limited, and may be mentioned, for example, a silicon wafer, a semiconductor wafer made from a compound such as GaAs, InP, and the like.

Figure 1:
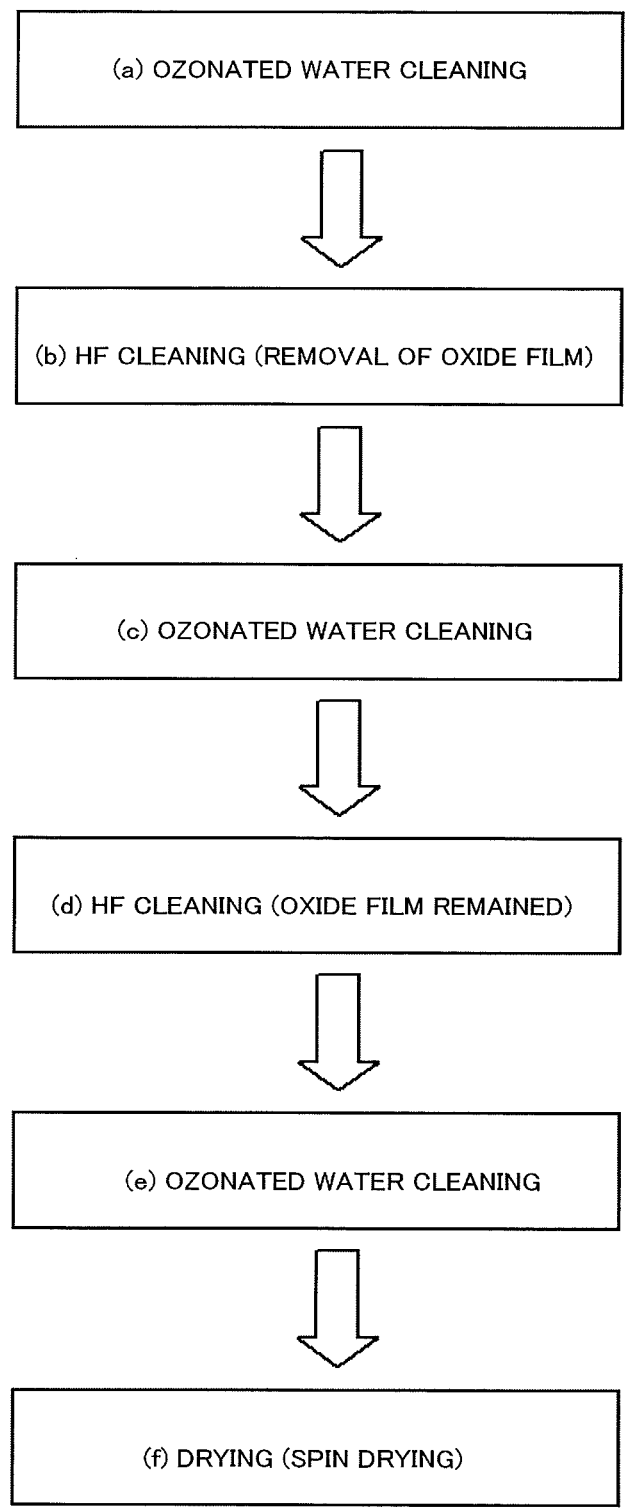
FIG. 1 is a flow chart showing an example of the method for cleaning a semiconductor wafer of the present invention.

Such a semiconductor wafer is subjected to cleaning along with, for example, the flow chart shown in FIG. 1.

First, the first ozonated water cleaning shown in FIG. 1(a) is carried out. A concentration of the ozonated water to be used herein can be made 3 ppm or more, preferably 5 ppm or more, more preferably 10 ppm or more, since the cleaning effect of the ozonated water is higher as the concentration is high. Incidentally, a process of the first ozonated water cleaning is to remove the organic materials attached to the surface of the semiconductor wafer, so that it may be omitted if the organic materials are not substantially attached to the prepared semiconductor wafer.

Next, as shown in FIGS. 1(b) to (d), the semiconductor wafer is subjected to cleaning with the cleaning step of HF cleaning, ozonated water cleaning, and HF cleaning in this order.

Here, in the present invention, when the final HF cleaning (which corresponds to HF cleaning of FIG. 1(d)) in the above-mentioned cleaning step is to be carried out, the cleaning is carried out so that a part of the thickness of the oxide film is remained on the surface of the semiconductor wafer without entirely removing the same formed on the surface of the semiconductor wafer by the ozonated water cleaning. By subjecting the procedure as mentioned above, after removing the metal impurities sufficiently from the surface of the semiconductor wafer by the previously carried out HF cleaning (FIG. 1(b)), it can be restrained the state that the oxide film formed on the surface of the semiconductor wafer by the ozonated water cleaning (which corresponds to ozonated water cleaning of FIG. 1(c)) is entirely removed to expose the bare surface so that the surface became the state where the particles are likely adhered thereto. According to this procedure, the metal impurity level and the particle level at the surface of the semiconductor wafer can be simultaneously reduced. Incidentally, the thickness of the oxide film to be partially remained on a surface of the semiconductor wafer at this time is not particularly limited, and it may be a thickness which can sufficiently protect the surface of the semiconductor wafer. Also, the ozonated water cleaning of FIG. 1(c) can be carried out in the same manner as the ozonated water cleaning of FIG. 1(a).

Also, in the first HF cleaning (which corresponds to HF cleaning of FIG. 1(b)) in the above-mentioned cleaning step is to be carried out, if the oxide film formed on the surface of the semiconductor wafer is to be entirely removed, the metal impurities at the surface of the semiconductor wafer can be more certainly removed, and further an oxide film which can protect the surface of the semiconductor wafer is formed by the ozonated water cleaning carried out thereafter, and the particle level is not degraded so it is preferred.

Incidentally, in FIG. 1, an example of subjecting to the cleaning step of $HF/O_3/HF$ only one time, but the present invention is not limited by the example, and it is possible to carry out the procedure twice or more, and further three times or more. At that time, in the HF cleaning at the second time or later, if the cleaning is so carried out that the oxide film formed by the ozonated water cleaning on the surface of the semiconductor wafer is not entirely removed but a part of the thickness thereof is remained on the surface of the semiconductor wafer, the particle level at the surface of the semiconductor wafer can be more effectively reduced so it is preferred.

In addition, as a method for carrying out the HF cleaning by not entirely removing the oxide film formed by the ozonated water cleaning on the surface of the semiconductor wafer but partially remaining the thickness thereof on the surface of the semiconductor wafer, it may be carried out, for example, by shortening the cleaning time so that the oxide film is not entirely dissolved, whereas it is not limited to the above-mentioned method.

When it is possible to supply two or more kinds of the HF cleaning solutions having different concentrations to the surface of the semiconductor wafer, a concentration of HF of the HF cleaning where a part of the thickness of the oxide film is remained on the surface of the semiconductor wafer may be made lower than a concentration of HF of the HF cleaning where the oxide film formed on the surface of the semiconductor wafer is entirely removed. In this case, in the HF cleaning where the clearing is so carried out that a part of the thickness of the oxide film is remained on the surface of the semiconductor wafer, if the concentration of HF is made 0.1 wt % to 1.5 wt %, there is neither the case where dissolution of the oxide film to take time too long, nor the case where control of the thickness becomes difficult due to the time for dissolving the oxide film being too short, so it is preferred. Of course, the cleaning time and the concentration of HF may be controlled simultaneously.

Also, in the method for cleaning the semiconductor wafer of the present invention, whereas it is not limited to the following, if cleaning of the semiconductor wafer is to be carried out by repeating alternately the operation of subjecting to the HF cleaning after the ozonated water cleaning, or to the ozonated water cleaning after the HF cleaning twice or more, the metal impurity level and the particle level of the surface of the semiconductor wafer can be reduced more effectively so it is preferred.

After subjecting to such a cleaning step, as shown in FIG. 1(e), the final ozonated water cleaning is carried out to form a protective oxide film for protecting the surface of the semiconductor wafer.

Then, as shown in FIG. 1(f), the semiconductor wafer on which the above-mentioned protective oxide film has been formed is dried.

Here, the above-mentioned HF cleaning and the ozonated water cleaning may be carried out, for example, by a single wafer processing spin cleaning, whereas the invention is not limited thereto. If the single wafer processing spin cleaning is employed, switching of the ozonated water cleaning and the HF cleaning, control of the concentration of the cleaning solution and control of the cleaning time can be easily carried out with high precision. Incidentally, when the above-mentioned HF cleaning and the ozonated water cleaning are carried out by the single wafer processing spin cleaning, it is preferred to dry the semiconductor wafer subjected to cleaning by spin drying since it is more efficient.

EXAMPLES

Hereinafter, the present invention is explained specifically by referring to Examples and Comparative Examples, but the present invention is not limited by these.

Example 1

First, 15 wafers of silicon single crystal wafers having a diameter of 300 mm and both surfaces of which are mirror polished to have clean surfaces were prepared. Next, 3 wafers of the silicon single crystal wafers among the 15 wafers having clean surfaces were pulled out, and one of which was subjected to particle measurement by a wafer surface defect testing equipment (Particle counter, LS-6800 (≥41 nm) product of Hitachi High-Technologies Corporation) to examine the particle level before cleaning. As a result of the measurement, it could be found out that the wafer particle level before the cleaning was good level of 100 particles or less. Also, to examine concentrations of metal impurities attached to the surface before cleaning, 2 wafers thereof were subjected to vapor phase decomposition of a natural oxide film at the wafer surface by HF vapor, and then, the metal impurities on the wafer surface were recovered by HF liquid drops, and measurement of the concentrations of the metal impurities on the wafer surface was carried out by an ICP-MS analysis device. As a result of the measurement, concentrations of metal (Al, Cr, Fe, Ni, Cu and Zn) impurities at the surface of the wafer before the experiment were shown in Table 4, and the elements other than Cu were detected.

Next, among the prepared silicon single crystal wafers, other 2 wafers thereof were subjected to cleaning as mentioned below, and measurement of the particle level and metal impurity level were carried out.

First, cleaning of the above-mentioned 2 wafers of the silicon single crystal wafers were carried out by the single wafer processing spin cleaning. At this time, cleaning was carried out as shown in Table 1, where the procedure of the ozonated water cleaning after the HF cleaning was repeated twice, an oxide film (natural oxide film) formed on the surface of the silicon single crystal wafer was entirely removed at the first time HF cleaning, and at the second time (final) HF cleaning, an oxide film formed on the surface of the silicon single crystal wafer by the ozonated water cleaning was not entirely removed to remain a part of the thickness thereof on the surface of the silicon single crystal wafer.

Also, as the cleaning conditions, a concentration of HF at the HF cleaning where the oxide film on the surface of the silicon single crystal wafer was entirely removed was 1.0 wt % and a rotation number of the wafer was 500 rpm/15 sec, a concentration of HF at the HF cleaning where the oxide film on the surface of the silicon single crystal wafer was remained a part of the thickness thereof was 1.0 wt % and a rotation number of the wafer was 500 rpm/3 sec, and a concentration of the ozonated water at the ozonated water cleaning was 10 ppm and a rotation number of the wafer was 500 rpm/15 sec.

Incidentally, the final ozonated water cleaning was carried out to form a protective oxide film which is to protect the surface of the silicon single crystal wafer. Also, there was substantially few impurities such as organic materials, and the like, attached onto the surface of the prepared silicon single crystal wafer, so that first ozonated water cleaning for removing the organic materials was not carried out.

Figure 2:
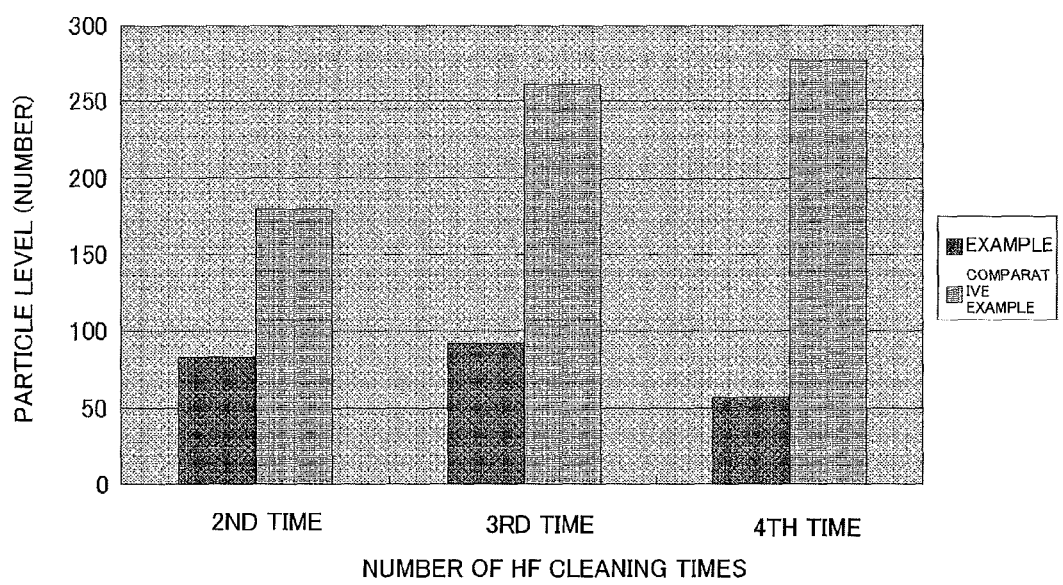
FIG. 2 is a view showing a graph of the particle level at the surface of the wafer in Examples and Comparative Examples of the respective number of the HF cleaning times.

2 wafers of the silicon single crystal wafers thus subjected to the cleaning were dried by spin drying with a rotation number of 1500 rpm/30 sec, and measurement of a particle level and a metal impurity level at the surface of the wafer were carried out by using the wafer surface defect testing equipment and the ICP-MS analysis device which are the same as those for measuring the particle level before subjecting to the cleaning. The results at this time are shown in Table 2, Table 3 and FIG. 2.

Example 2

Among the silicon single crystal wafers prepared in Example 1, 2 wafers thereof were subjected to cleaning as mentioned below, and measurement of the particle level and metal impurity level were carried out.

As shown in Table 1, cleaning of the silicon single crystal wafer was carried out in the same manner as in Example 1 except that the cleaning was carried out by repeating the ozonated water cleaning after the HF cleaning three times, where the oxide film formed on the surface of the silicon single crystal wafer was entirely removed at the first time HF cleaning, and in all the HF cleanings at the second time or later, the oxide film on the surface of the silicon single crystal wafer by the ozonated water cleaning was not entirely removed to remain a part of the thickness thereof on the surface of the silicon single crystal wafer.

Measurement of the particle level and the metal impurity level at the surface of the silicon single crystal wafer thus subjected to cleaning were carried out in the same manner as in Example 1. The results at this time are shown in Table 2, Table 3 and FIG. 2.

Example 3

Among the silicon single crystal wafers prepared in Example 1, 2 wafers thereof were subjected to cleaning as mentioned below, and measurement of the particle level and metal impurity level were carried out.

As shown in Table 1, cleaning of the silicon single crystal wafer was carried out in the same manner as in Example 1 except that the cleaning was carried out by repeating the ozonated water cleaning after the HF cleaning four times, where the oxide film formed on the surface of the silicon single crystal wafer was entirely removed at the first time HF cleaning, and in all the HF cleanings at the second time or later, the oxide film on the surface of the silicon single crystal wafer by the ozonated water cleaning was not entirely removed to remain a part of the thickness thereof on the surface of the silicon single crystal wafer.

Measurement of the particle level and the metal impurity level at the surface of the silicon single crystal wafer thus subjected to cleaning were carried out in the same manner as in Example 1. The results at this time are shown in Table 2, Table 3 and FIG. 2.

Comparative Example 1

Among the silicon single crystal wafers prepared in Example 1, 2 wafers thereof were subjected to cleaning as mentioned below, and measurement of the particle level and metal impurity level were carried out.

As shown in Table 1, cleaning of the silicon single crystal wafer was carried out in the same manner as in Example 1 except that the cleaning was carried out by repeating the ozonated water cleaning after the HF cleaning twice, where the oxide film formed on the surface of the silicon single crystal wafer was entirely removed at all the HF cleanings.

Measurement of the particle level and the metal impurity level at the surface of the silicon single crystal wafer thus subjected to cleaning were carried out in the same manner as in Example 1. The results at this time are shown in Table 2, Table 3 and FIG. 2.

Comparative Example 2

Among the silicon single crystal wafers prepared in Example 1, 2 wafers thereof were subjected to cleaning as mentioned below, and measurement of the particle level and metal impurity level were carried out.

As shown in Table 1, cleaning of the silicon single crystal wafer was carried out in the same manner as in Comparative Example 1 except that the cleaning was carried out by repeating the ozonated water cleaning after the HF cleaning three times.

Measurement of the particle level and the metal impurity level at the surface of the silicon single crystal wafer thus subjected to cleaning were carried out in the same manner as in Example 1. The results at this time are shown in Table 2, Table 3 and FIG. 2.

Comparative Example 3

Among the silicon single crystal wafers prepared in Example 1, 2 wafers thereof were subjected to cleaning as mentioned below, and measurement of the particle level and metal impurity level were carried out.

As shown in Table 1, cleaning of the silicon single crystal wafer was carried out in the same manner as in Comparative Example 1 except that the cleaning was carried out by repeating the ozonated water cleaning after the HF cleaning four times.

Measurement of the particle level and the metal impurity level at the surface of the silicon single crystal wafer thus subjected to cleaning were carried out in the same manner as in Example 1. The results at this time are shown in Table 2, Table 3 and FIG. 2.

TABLE 1

| Cleaning conditions | 1st HF Cleaning | 2nd HF Cleaning | 3rd HF Cleaning | 4th HF Cleaning |
|---|---|---|---|---|
| Example 1 | HF (15 sec) →$O_3$ (15 sec) | HF (3 sec) →$O_3$ (15 sec) | | |
| Example 2 | HF (15 sec) →$O_3$ (15 sec) | HF (3 sec) →$O_3$ (15 sec) | HF (3 sec) →$O_3$ (15 sec) | |
| Example 3 | HF (15 sec) →$O_3$ (15 sec) | HF (3 sec) →$O_3$ (15 sec) | HF (3 sec) →$O_3$ (15 sec) | HF (3 sec) →$O_3$ (15 sec) |
| Comparative Example 1 | HF (15 sec) →$O_3$ (15 sec) | HF (15 sec) →$O_3$ (15 sec) | | |
| Comparative Example 2 | HF (15 sec) →$O_3$ (15 sec) | HF (15 sec) →$O_3$ (15 sec) | HF (15 sec) →$O_3$ (15 sec) | |
| Comparative Example 3 | HF (15 sec) →$O_3$ (15 sec) | HF (15 sec) →$O_3$ (15 sec) | HF (15 sec) →$O_3$ (15 sec) | HF (15 sec) →$O_3$ (15 sec) |

TABLE 2

| | Example | Comparative Example |
|---|---|---|
| 2nd HF Cleaning | 84 | 179 |
| 3rd HF Cleaning | 92 | 261 |
| 4th HF Cleaning | 57 | 278 |

Unit: number

TABLE 3

| Cleaning conditions | Al | Cr | Fe | Ni | Cu | Zn |
|---|---|---|---|---|---|---|
| Example 1 | N.D. | N.D. | N.D. | N.D. | N.D. | N.D. |
| Example 2 | N.D. | N.D. | N.D. | N.D. | N.D. | N.D. |
| Example 3 | N.D. | N.D. | N.D. | N.D. | N.D. | N.D. |
| Comparative Example 1 | N.D. | N.D. | N.D. | N.D. | N.D. | N.D. |
| Comparative Example 2 | N.D. | N.D. | N.D. | N.D. | N.D. | N.D. |
| Comparative Example 3 | N.D. | N.D. | N.D. | N.D. | N.D. | N.D. |
| Lower detection limit (×$10^8$ atoms/$cm^2$) | 0.01 | 0.01 | 0.01 | 0.01 | 0.01 | 0.01 |

TABLE 4

| | Al | Cr | Fe | Ni | Cu | Zn |
|---|---|---|---|---|---|---|
| Before cleaning (1) | 1.00 | 0.10 | 0.50 | 0.05 | N.D. | 0.30 |
| Before cleaning (2) | 0.90 | 0.11 | 0.30 | 0.08 | N.D. | 0.40 |
| Lower detection limit (×$10^8$ atoms/$cm^2$) | 0.01 | 0.01 | 0.01 | 0.01 | 0.01 | 0.01 |

From the results of Examples and Comparative Examples, when the cleaning was carried out by entirely removing the oxide film formed on the surface of the silicon single crystal wafer by all the HF cleanings as in Comparative Examples, it can be understood that even when the HF cleaning and the ozonated water cleaning are repeated, the particle level of the surface of the semiconductor wafer is not lowered but rather heightened. However, in Examples, it can be understood that by the HF cleaning at the second time or later, a part of the thickness of the oxide film is remained on the surface of the semiconductor wafer, the surface of the semiconductor wafer does not become a water-repellent surface to which particles are likely adhered, and a semiconductor wafer reduced in the particle level can be obtained. Moreover, as shown in Table 3, in both of Comparative Examples and Examples, wafer surface concentrations of the metal impurities at the surface of the wafer are all not detected (N.D.), in Examples, it can be confirmed that a wafer surface with less metal impurities concentration could be obtained even when a part of the thickness of the oxide film is remained on the surface of the semiconductor wafer by the HF cleaning at the second time or later. That is, according to the method for cleaning the semiconductor wafer of the present invention, it can be understood that the metal impurity level and the particle level on the surface of the semiconductor wafer can be simultaneously reduced.

Incidentally, in Examples 1 to 3, cleaning was carried out by remaining a part of the thickness of the oxide film on the surface of the silicon single crystal wafer by shortening the cleaning time of the HF cleaning at the second time or later, and it may be carried out by making the concentration of HF thereof lower than the concentration of the first HF cleaning, or controlling the cleaning time and the concentration of HF simultaneously.

Also, in Example 2 and Example 3, cleaning was carried out by remaining a part of the thickness of the oxide film on the surface of the silicon single crystal wafer in all the HF cleanings at the second time or later, and in the respective Examples, the effects of the present invention can be sufficiently obtained if the cleaning is carried out by remaining a part of the thickness of the oxide film on the surface of the silicon single crystal wafer at the final HF cleaning alone.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

The invention claimed is:

1. A method for cleaning a semiconductor wafer, the method comprising:
   cleaning steps of HF cleaning, ozonated water cleaning and HF cleaning in this order at least one time; wherein
   the semiconductor wafer is subjected to cleaning by carrying out the HF cleaning after the ozonated water cleaning or carrying out the ozonated water cleaning after the HF cleaning which procedure is alternately repeated twice or more,
   an oxide film formed on a surface of the semiconductor wafer is entirely removed in the HF cleaning at a first time in the method for cleaning the semiconductor wafer,
   an oxide film is formed on the surface of the semiconductor wafer by the ozonated water cleaning carried out after the HF cleaning at a first time in the method for cleaning the semiconductor wafer, and
   in the HF cleaning carried out at the second time or later in the method for cleaning the semiconductor wafer, cleaning is so carried out that the oxide film formed on the surface of the semiconductor wafer by the ozonated water cleaning is not entirely removed and remains a part of a thickness thereof on the surface of the semiconductor wafer.

2. The method for cleaning a semiconductor wafer according to claim 1, wherein a concentration of HF is made 0.1 wt % to 1.5 wt % in the HF cleaning where the oxide film formed on the surface of the semiconductor wafer by the ozonated water cleaning is not entirely removed and remains a part of a thickness thereof on the surface of the semiconductor wafer.

3. The method for cleaning a semiconductor wafer according to claim 1, wherein a concentration of the ozonated water is made 3 ppm or more in the ozonated water cleaning.

4. The method for cleaning a semiconductor wafer according to claim 2, wherein a concentration of the ozonated water is made 3 ppm or more in the ozonated water cleaning.

5. The method for cleaning a semiconductor wafer according to claim 1, wherein the HF cleaning and the ozonated water cleaning of the semiconductor wafer are carried out by single wafer processing spin cleaning.

6. The method for cleaning a semiconductor wafer according to claim 4, wherein the HF cleaning and the ozonated water cleaning of the semiconductor wafer are carried out by single wafer processing spin cleaning.

* * * * *